US008593895B2

(12) United States Patent
Takayama et al.

(10) Patent No.: US 8,593,895 B2
(45) Date of Patent: Nov. 26, 2013

(54) SEMICONDUCTOR DEVICE AND CONTROL METHOD THEREOF (75) Inventors: Shinichi Takayama, Tokyo (JP); Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 12 days.

(21) Appl. No.: 13/404,940

(22) Filed: Feb. 24, 2012

(65) Prior Publication Data

US 2012/0218845 A1   Aug. 30, 2012

(30) Foreign Application Priority Data

Feb. 25, 2011   (JP) .................................. 2011-040959

(51) Int. Cl.
*G11C 7/12* (2006.01)
(52) U.S. Cl.
USPC .......................................................... 365/201
(58) Field of Classification Search
USPC .......................................................... 365/201
See application file for complete search history.

(56) References Cited

U.S. PATENT DOCUMENTS

| 5,745,420 A *   | 4/1998  | McClure ........................ 365/201 |
| 2004/0165409 A1* | 8/2004  | Chevallier ........................ 365/63 |
| 2004/0204891 A1 | 10/2004 | Horihata et al. |
| 2011/0216602 A1* | 9/2011  | Kim et al. ................. 365/185.22 |

FOREIGN PATENT DOCUMENTS

JP        2004-288299 A     10/2004

* cited by examiner

*Primary Examiner* — Hoai V Ho
*Assistant Examiner* — Jay Radke
(74) *Attorney, Agent, or Firm* — Sughrue Mion, PLLC (57) ABSTRACT

Disclosed herein is a semiconductor device comprising an array having a hierarchical bit line structure, global bit lines adjacent to each other, local bit lines corresponding to the global bit lines, hierarchical switches, precharge circuits precharging the global bit lines, precharge circuits precharging the local bit lines, and a control circuit. When performing a test of the array, precharge voltages for the global bit lines are set to potentials different from each other, and the control circuit controls the potentials to be applied to the local bit lines through the global bit lines and the hierarchical switches.

15 Claims, 8 Drawing Sheets

SEMICONDUCTOR DEVICE AND CONTROL METHOD THEREOF

BACKGROUND OF THE INVENTION

1. Field of the Invention

The present invention relates to a semiconductor device having a bit line structure hierarchized into global bit lines and local bit lines, and relates to a control method thereof.

2. Description of Related Art

In recent years, miniaturization of memory cells has been achieved in semiconductor devices such as DRAM, and thus an increase in the number of memory cells connected to a bit line has caused a performance problem such as an increase in bit line capacitance. In order to overcome such a problem, a configuration in which the bit lines are hierarchized into global bit lines and local bit lines has been proposed. In a hierarchical memory cell array of this kind, data stored in a memory cell is read out to a local bit line and thereafter transmitted to a global bit line through a hierarchical switch. In a general DRAM, the bit lines need to be precharged to a predetermined voltage before a read operation, and therefore a configuration provided with a precharge circuit and wiring lines for a precharge voltage (precharge lines) is employed (for example, see Patent Reference 1). On the other hand, in the hierarchical memory cell array, the local bit lines and the global bit lines need to be separately precharged, and therefore a configuration in which precharge circuits and wiring lines are provided for both the local bit lines and the global bit lines should be employed. For example, a hierarchical bit line structure is known, in which a plurality of local bit lines are electrically connected to one global bit line through corresponding hierarchical switches. Normally, since there is provided a predetermined number of local bit lines corresponding to each one of the global bit lines, an area for arranging a plurality of precharge circuits and a plurality of precharge lines is required in relation to the predetermined number of local bit lines.

[Patent Reference 1] Japanese Patent Application Laid-open No. 2004-288299 (U.S. Pub. No. 2004/0204891 A1)

In general, one of the test operations for the DRAM is a voltage stress test of memory cells. The voltage stress test is performed by writing different voltages into the memory cells through adjacent bit lines to which the memory cells are connected for the purpose of determining whether or not the memory cells operate normally. Particularly, a large voltage stress can be applied to a plurality of bit lines by supplying a high voltage to odd numbered bit lines and supplying a low voltage to even numbered bit lines. However, when the voltage stress test is performed for the hierarchical memory cell array, two kinds of precharge circuits and two kinds of precharge lines need to be provided to supply at least two kinds of voltages different from each other to a plurality of local bit lines adjacent to one another that extend in the same direction. Particularly, the precharge lines extend in a direction intersecting the local bit lines, inevitably resulting in an increase in area. For example, when there are M local bit lines corresponding to each one of the global bit lines, it is only necessary to provide M precharge lines in a normal operation, and however 2M precharge lines need to be provided for the purpose of performing the voltage stress test of the memory cells. This causes a problem that the area of the memory cell array remarkably increases.

SUMMARY

A semiconductor device according to an embodiment of the disclosure comprises: an array having a hierarchical bit line structure; first and second global bit lines physically adjacent to each other; a plurality of first local bit lines corresponding to the first global bit line and corresponding to a plurality of sub-arrays forming the array, a plurality of second local bit lines corresponding to the second global bit line and corresponding to the plurality of sub-arrays, the second local bit lines being physically adjacent to the first local bit lines respectively; a plurality of first hierarchical switches controlling electrical connections between the first global bit line and the first local bit lines; a plurality of second hierarchical switches controlling electrical connections between the second global bit line and the second local bit lines respectively; a first precharge circuit precharging the first global bit line to a first precharge voltage; a second precharge circuit precharging the second global bit line to a second precharge voltage; a plurality of third precharge circuits precharging the first local bit lines to a third precharge voltage respectively; a plurality of fourth precharge circuits precharging the second local bit lines to the third precharge voltage respectively; and a control circuit controlling the first to third precharge circuits and voltage values of the first to third precharge voltages. In the semiconductor device, when performing a test of the array, by achieving a state in which the first and second precharge voltages are set to first and second potentials different from each other, the first and second precharge circuits are activated, the third and fourth precharge circuits are inactivated, and the first and second hierarchical switches are brought into a connected state, the control circuit controls the first and second potentials to be applied to the first and second local bit lines through the first and second global bit lines respectively.

DETAILED DESCRIPTION OF THE PREFERRED EMBODIMENTS

It is apparent that the present invention is not limited to embodiments described below, but should be construed based on the disclosure of the claims.

Figure 1:
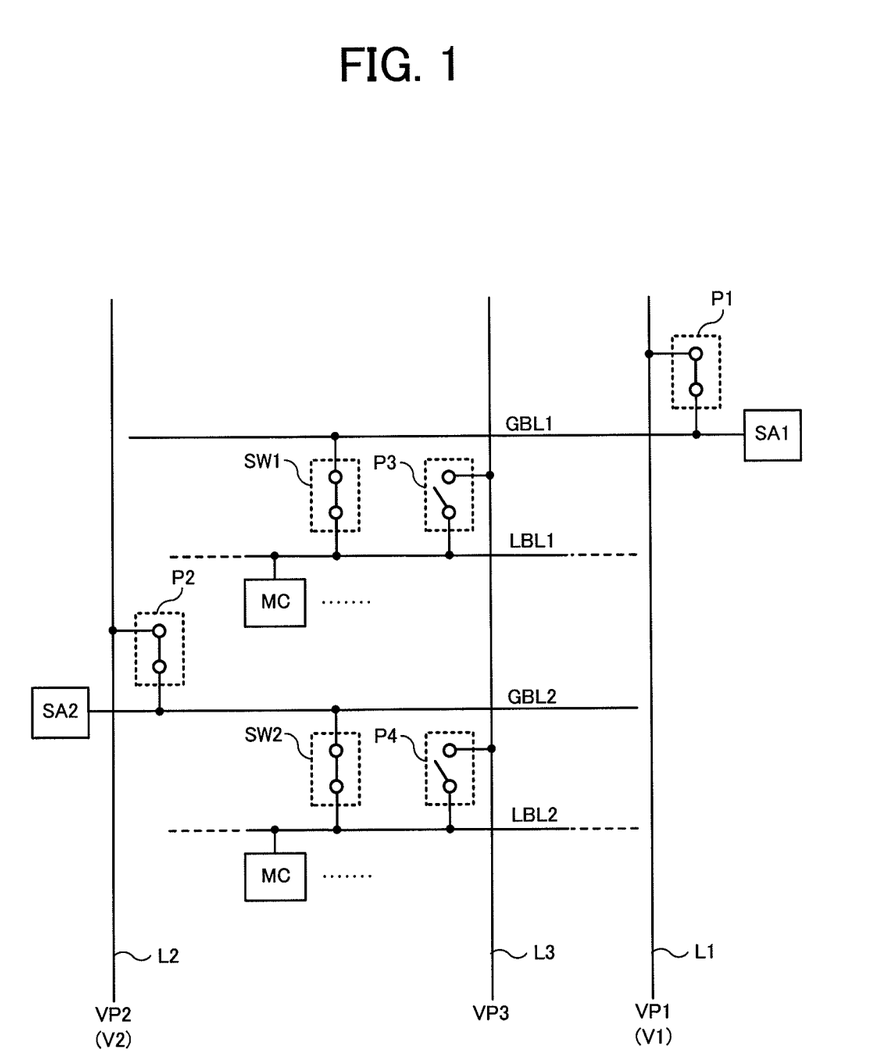
FIG. 1 is a diagram showing an embodiment of the invention.

As shown in FIG. 1, an embodiment of the invention is a semiconductor device comprising a memory cell array having a hierarchical bit line structure. The semiconductor device shown in FIG. 1 comprises global bit lines GBL1 and GBL2, sense amplifiers SA1 and SA2, local bit lines LBL1 and LBL2, hierarchical switches SW1 and SW2, precharge circuits P1, P2, P3 and P4, and a control circuit (not shown). The sense amplifiers SA1 and SA2 are arranged in areas opposite to each other relative to the memory cell array, one sense amplifier SA1 amplifies a signal voltage of the global bit line GBL1, and the other sense amplifier SA2 amplifies a signal voltage of the global bit line GBL2. In case of arranging a plurality of global bit lines GBL, they are alternately connected to the sense amplifiers SA1 and SA2 on both sides. The local bit line LBL1 can be connected to the global bit line GBL1 through the hierarchical switch SW1, and the local bit line LBL2 can be connected to the global bit line GBL2 through the hierarchical switch SW2. Although not show in FIG. 1, for example, a predetermined number of local bit lines LBL corresponding to each one of the global bit lines GBL are arranged and can be selectively connected to the corresponding global bit lines GBL through a predetermined number of hierarchical switches SW. A plurality of memory cells belong to each of the local bit lines LBL1 and LBL2.

The precharge circuit P1 precharges the global bit line GBL1 to a precharge voltage VP1. The precharge circuit P2 precharges the global bit line GBL2 to a precharge voltage VP2. The precharge circuits P3 and P4 precharge the local bit lines LBL1 and LBL2 to a precharge voltage VP3, respectively. Lines L1, L2 and L3 are wiring lines for supplying the precharge voltages VP1, VP2 and VP3, respectively. One line L1 and one line L2 are arranged on both sides of the memory cell array, and a plurality of lines L3 are arranged in the memory cell array when there are provided the predetermined number of local bit lines LBL corresponding to each one of the global bit lines GBL.

When a voltage stress test of the memory cells MC is performed in the memory cell array of FIG. 1, different potentials V1 and V2 need to be supplied to two local bit lines LBL1 and LBL2. Therefore, the precharge voltages VP1 and VP2 that have been respectively set to the potentials V1 and V2 are supplied to the global bit lines GBL1 and GBL2 through the precharge circuits P1 and P2. At this point, the precharge circuits P3 and P4 are inactivated, and the hierarchical switches SW1 and SW2 are brought into a connected state. Thereby, the potentials V1 and V2 of the global bit lines GBL1 and GBL2 are also supplied to the local bit lines LBL1 and LBL2. Thus, it is not necessary to use the respective precharge circuits P3, P4 and the lines L3 for the purpose of supplying the different potentials V1 and V2 to the local bit lines LBL1 and LBL2 during test, thereby suppressing an increase in area. Particularly, when the number of local bit lines LBL corresponding to each one of the global bit lines GBL increases, it is possible to obtain a large effect of suppressing the increase in area.

Figure 2:
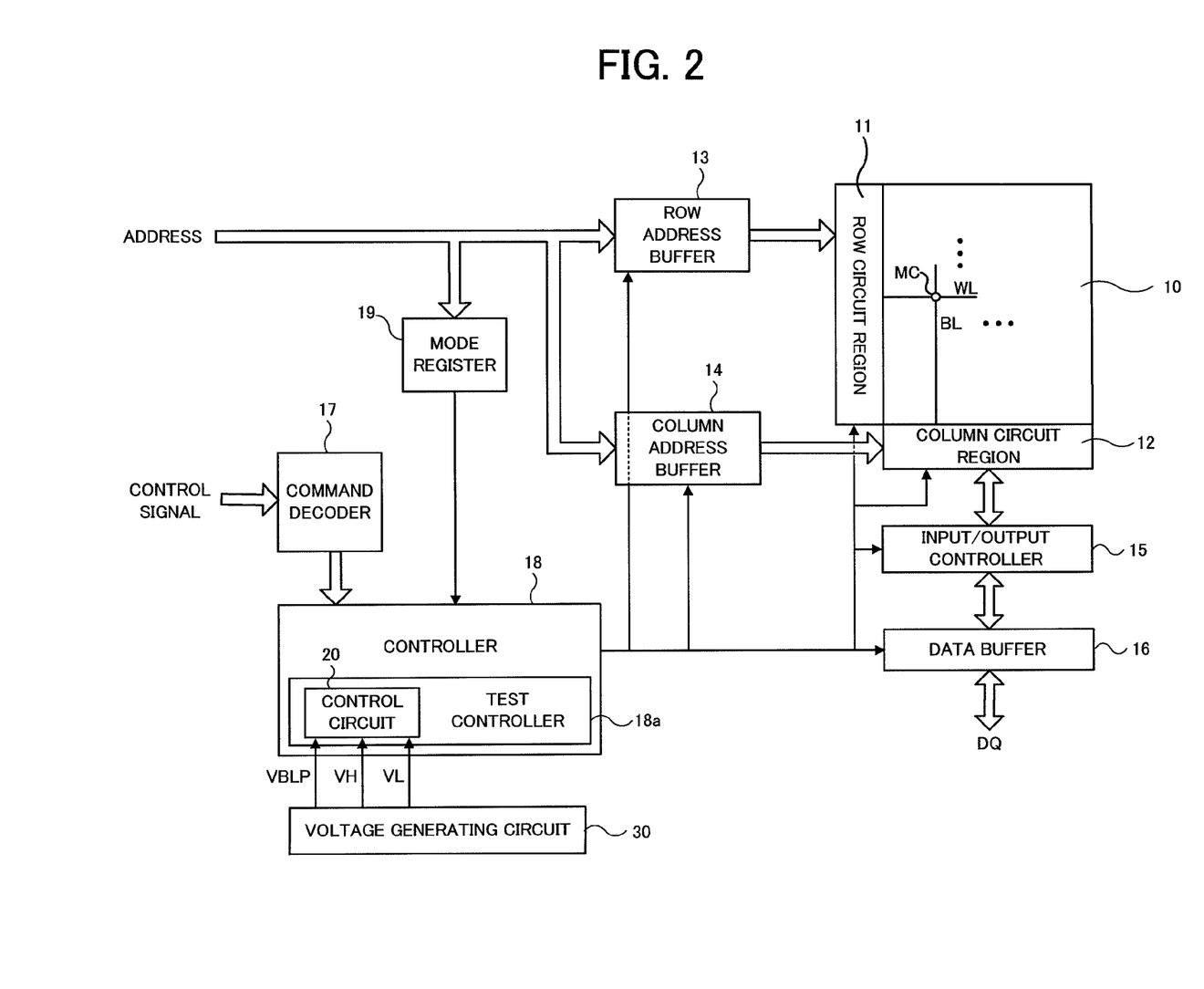
FIG. 2 is a diagram showing an entire configuration of a DRAM of an embodiment.

Further embodiments will be described hereafter. FIG. 2 is a block diagram showing an entire configuration of a DRAM (Dynamic Random Access Memory) as the semiconductor device of an embodiment. In the DRAM shown in FIG. 2, there are provided a memory cell array region 10 including a large number of memory cells MC arranged at intersections of a plurality of word lines WL and a plurality of bit lines BL, and row circuits 11 and column circuits 12 that are attached to the memory cell array region 10. As described later, the bit lines BL in the memory cell array region 10 are hierarchized into global bit lines GBL of an upper hierarchy and local bit lines LBL of a lower hierarchy. The row circuits 11 includes a plurality of circuits provided corresponding to the plurality of word lines WL, and the column circuits 12 includes a plurality of circuits provided corresponding to the plurality of bit lines BL. Although not show in FIG. 2, the memory cell array region 10 can be divided into a plurality of memory banks.

An externally received address includes a row address and a column address. The row address is stored in a row address buffer 13 and sent to the row circuits 11. The column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ). A command decoder 17 determines a command for the DRAM based on externally received control signals and sends the command to a control circuit 18.

The controller 18 controls operations of respective parts of the DRAM according to a command type determined by the command decoder 17. The controller 18 outputs control signals for controlling later-described hierarchical switches and precharge circuits. Further, the controller 18 includes a test controller 18a that controls a test operation in which a predetermined test is performed for the DRAM of the embodiments. Meanwhile, a mode register 19 selectively sets operation modes of the DRAM based on the above address and sends setting information to the control circuit 18.

A voltage generating circuit 30 generates a precharge voltage VBLP, a potential VL and a potential VH based on a power supply voltage supplied from an external power supply terminal (not shown), and supplies them to a control circuit 20 included in the test controller 18a. The potentials VL and VH may be supplied from outside the device.

Figure 3:
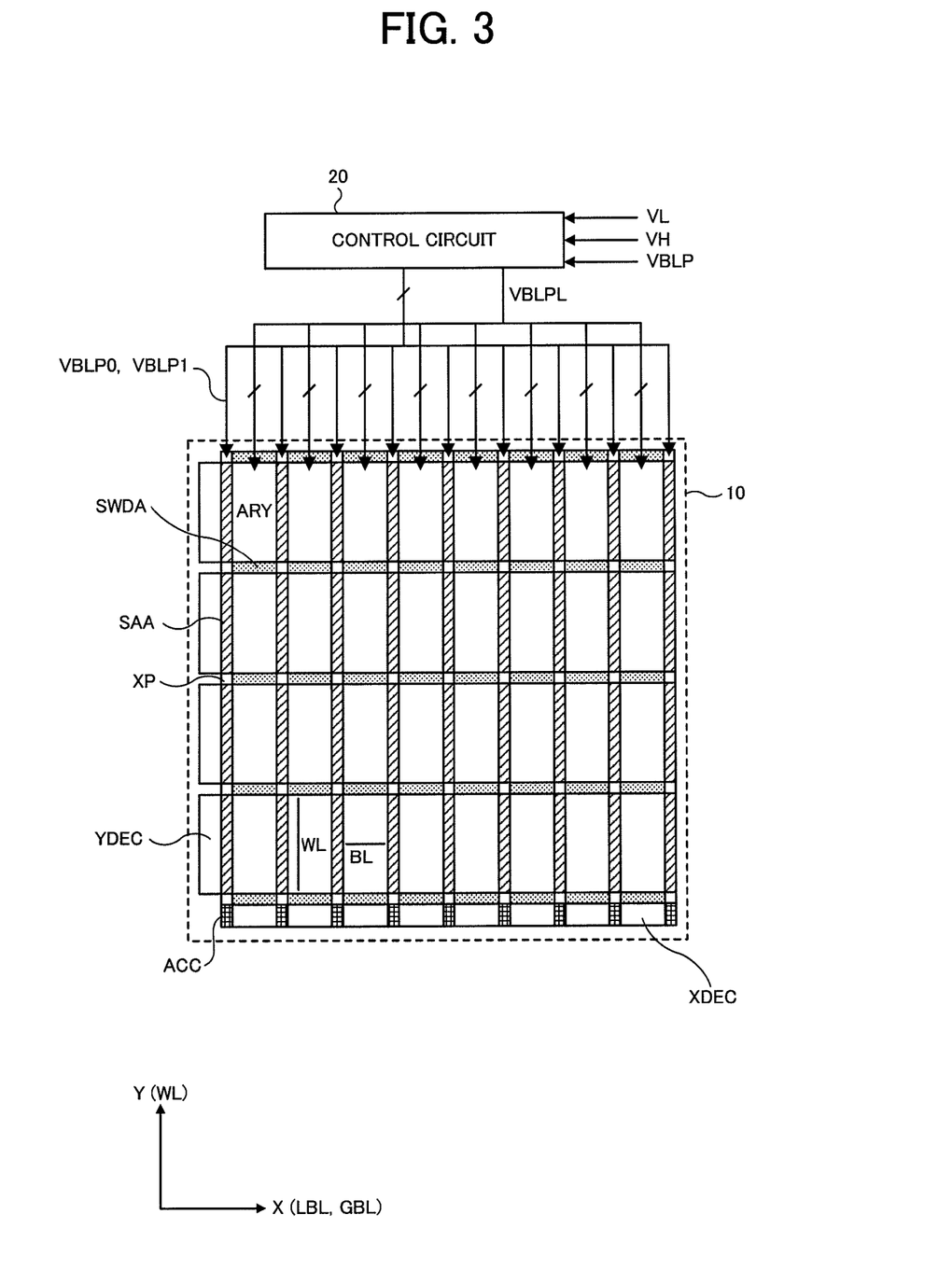
FIG. 3 is a diagram showing a configuration of a memory cell array region of FIG. 2.

FIG. 3 is a block diagram showing a configuration of the memory cell array region 10 of FIG. 2. X and Y directions perpendicular to each other are shown with arrows for convenience in the lower side of FIG. 3. The X direction is an extending direction of the bit lines BL (later-described global bit lines GBL and local bit lines LBL), and the Y direction is an extending direction of the word lines WL. As shown in FIG. 3, a plurality of memory cell arrays ARY are arranged in a matrix form in the memory cell array region 10. On the periphery of each memory cell array ARY, a sense amplifier array SAA including a plurality of sense amplifiers SA is disposed at an end in the X direction, and a sub-word driver array SWDA including a plurality of sub-word drivers is disposed at an end in the Y direction. A cross area XP is disposed in a circuit area where sub-word driver arrays SWDA and sense amplifier arrays SAA intersect each other. In an outer periphery of the memory cell array region 10, there are Y decoders YDEC arranged at an end in the X direction, and X decoders XDEC and array control circuits ACC respectively arranged at an end in the Y direction. Although not show in FIG. 3, each memory cell array ARY may be segmented into a plurality sub-arrays aligned in the X direction (bit line extending direction), which will be shown in FIG. 4.

The control circuit 20 is supplied with the precharge voltage VBLP and the potentials VL and VH, and the control circuit 20 supplies precharge voltages VBLPL, VBLP0 and VBLP1 to the plurality of memory cell arrays ARY.

Figure 4:
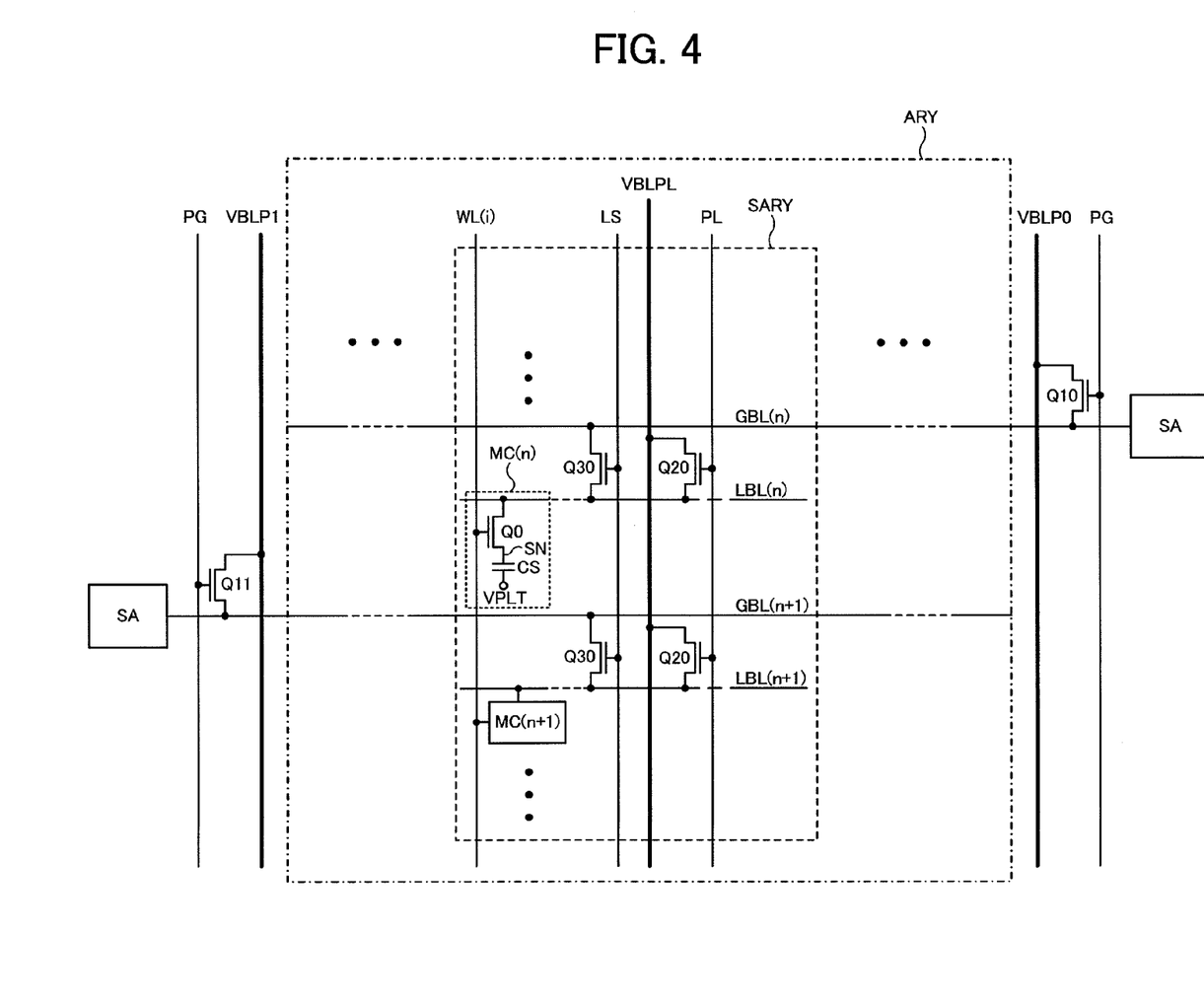
FIG. 4 is a diagram showing a circuit configuration example of a memory cell array and its periphery in FIG. 3.

Next, FIG. 4 shows a circuit configuration example of the memory cell array ARY and its periphery in FIG. 3. In the memory cell array ARY, a plurality of global bit lines GBL each extending in the X direction are arranged adjacently in the Y direction with a predetermined pitch. Among these, FIG. 4 shows a range of adjacent two global bit lines GBL (n) and GBL (n+1). Further, a predetermined number of local bit lines LBL segmented in relation to a plurality of sub-arrays SARY are arranged corresponding to each one of the global bit lines GBL. For example, M×L local bit lines LBL are arranged in a configuration in which L global bit lines GBL are arranged in the memory cell array ARY and M local bit lines LBL are corresponded to each one of the global bit lines GBL. In this configuration, a structural unit including L local bit lines LBL arranged in the Y direction forms one sub-array SARY. Therefore, the memory cell array ARY includes M sub-arrays SARY aligned in the X direction.

FIG. 4 shows only two local bit lines LBL(n) and LBL(n+1) corresponding to the global bit lines GBL(n) and GBL(n+1). The global bit line GBL(n) is the first global bit line, and the global bit line GBL(n+1) is the second global bit line. Similarly, the local bit line LBL(n) is the first local bit line, and the local bit line LBL(n+1) is the second local bit line.

A plurality of memory cells MC formed at intersections of a plurality of word lines WL and each local bit line LBL are connected to the local bit line LBL. The example of FIG. 4 only shows two memory cells MC(n) and MC(n+1) that are formed at intersections of one word line WL(i) and the two local bit lines LBL (n) and LBL (n+1). Each memory cell MC is composed of a selection transistor Q0 selectively switched by a word line WL and a capacitor CS storing data as electric charge of a data storage node SN, and a plate voltage VPLT is supplied to the capacitor CS.

As shown in FIG. 4, one global bit line GBL(n) is connected to a sense amplifier SA (the first sense amplifier) of a sense amplifier array SAA (FIG. 3) on the right, and the other global bit line GBL(n+1) is connected to a sense amplifier SA (the second sense amplifier) of a sense amplifier array SAA on the left. In this manner, the sense amplifiers SA on both sides are alternately arranged with respect to the plurality of global bit lines GBL. Here, assuming that the L global bit lines GBL are represented as, for example, global bit lines GBL(0), GBL(1) to GBL(L−1) from the upper side of FIG. 4, even numbered global bit lines GBL are connected to sense amplifiers SA on the right, and odd numbered global bit lines GBL are connected to sense amplifiers SA on the left. In addition, FIG. 4 shows a case where n is an even number for the adjacent two global bit lines GBL(n) and GBL(n+1). In the following, descriptions for one global bit line GBL (n) are assumed to be common to all even numbered global bit lines GBL, and descriptions for the other global bit line GBL (n+1) are assumed to be common to all odd numbered global bit lines GBL. The arrangement of the local bit lines LBL corresponds to the global bit lines GBL.

With respect to one global bit line GBL(n), there is provided a transistor Q10 as the first precharge circuit near the sense amplifier SA on the right. The transistor Q10 is an NMOS type transistor that precharges the global bit line GBL(n) to the precharge voltage VBLP0 (the first precharge voltage) when a precharge signal PG (the first precharge signal) applied to its gate is at a high level. With respect to the other global bit line GBL (n+1), there is provided a transistor Q11 as the second precharge circuit near the sense amplifier SA on the left. The transistor Q11 is an NMOS type transistor that precharges the global bit line GBL(n+1) to the precharge voltage VBLP1 (the second precharge voltage) when the precharge signal PG applied to its gate is at a high level. Lines for supplying the precharge voltages VBLP0, VBLP1 and the precharge signal PG extend in the Y direction, respectively.

Further, with respect to each local bit line bit line LBL, there is provided a transistor Q20 as the third or fourth precharge circuit. The transistor Q20 is an NMOS type transistor that precharges the local bit line bit line LBL to the precharge voltage VBLPL (the third precharge voltage) when a precharge signal PL (the second precharge signal) applied to its gate is at a high level.

The precharge voltage VBLPL is supplied to each of the plurality of sub-arrays SARY. In other words, the number of lines for supplying the precharge voltage VBLPL matches the number of the sub-arrays SARY. On the contrary, the number of lines for supplying the precharge voltages VBLP0 and VBLP1 does not depend on the number of the sub-arrays SARY.

Furthermore, there is provided a transistor Q30 as the hierarchical switch between the global bit line GBL and the local bit line LBL. The transistor Q30 is an NMOS type transistor that controls an electrical connection between the global bit line GBL and the local bit line LBL in response to a control signal LS applied to its gate. By selectively setting the control signal LS to a high level, corresponding N transistors Q30 turn on so that L global bit lines GBL in total are connected to L local bit lines LBL respectively.

In addition, assuming that the L global bit lines GBL and the M×L local bit lines LBL are arranged in FIG. 4, L/2 transistors Q10, L/2 transistors Q11, M×L transistors Q20, and M×L transistors Q30 are arranged, respectively.

Figure 5A:
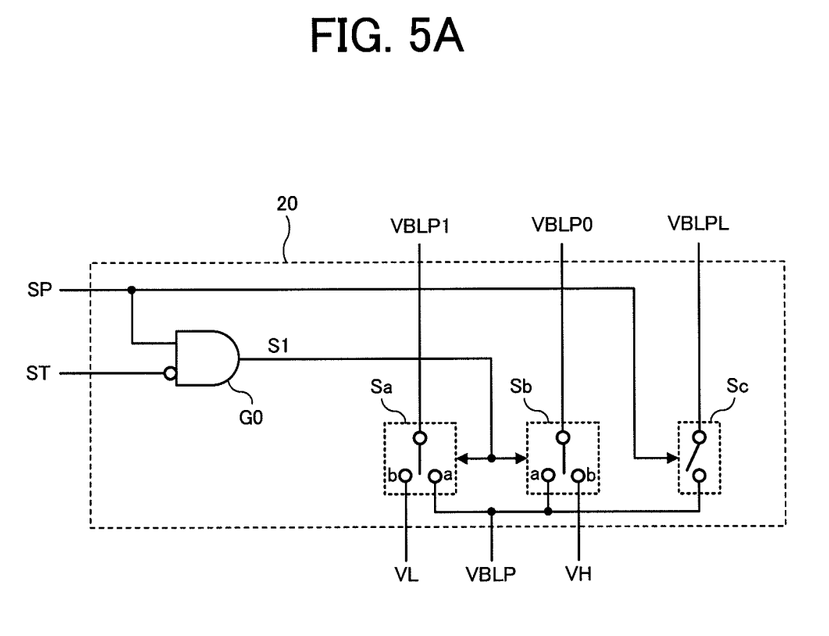
FIGS. 5A and 5B are diagrams showing configuration examples of control circuits included in a test controller of FIG. 2.
Figure 5B:
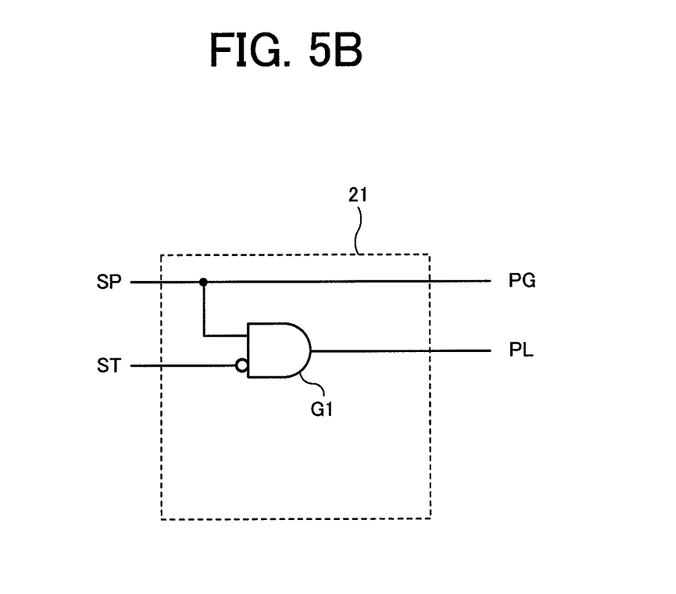

FIGS. 5A and 5B show configuration examples of control circuits 20 and 21 included in the test controller 18a of FIG. 2. The control circuits 20 and 21 have a function of controlling the precharge voltages VBLPL, VBLP0 and VBLP1 and the precharge signals PG and PL of FIG. 4 in accordance with an operation state of the DRAM. The control circuit 20 of FIG. 5A includes an AND gate G0 and three switches Sa, Sb and Sc. The AND gate G0 receives a control signal SP for controlling a precharge operation of the local bit lines LBL and an inverted signal of a test signal ST for controlling the test operation, and outputs a result of an AND operation as a signal S1. Here, the test signal ST is set to a high level in the test operation.

The switch Sa is controlled so that a voltage value of the precharge voltage VBLP1 supplied to the odd numbered global bit lines GBL is switched to either the precharge voltage VBLP ("a" side) or the potential VL ("b" side) in response to the signal S1. The switch Sb is controlled so that a voltage value of the precharge voltage VBLP0 supplied to the even numbered global bit lines GBL is switched to either the precharge voltage VBLP ("a" side) or the potential VH ("b" side) in response to the signal S1. The potential VL is set lower than a ground potential VSS, and the potential VH is set higher than a power supply voltage VARY. It is assumed in FIG. 5A that when the test signal ST is at a low level to designate a normal operation, the switches Sa and Sb are respectively connected to the "a" side, and the switch Sc is closed by a high level of the control signal SP (starting precharging) and opened by a low level of the control signal SP (stopping precharging). And when the test signal ST and the control signal SP are respectively at a high level to designate the test operation, switches Sa and Sb are respectively connected to the "b" side, and the switch Sc is closed. Further, the switch Sc controls a connection between the precharge voltage VBLPL supplied to the local bit lines LBL and the precharge voltage VBLP in response to the control signal SP.

Meanwhile, the control circuit 21 of FIG. 5B includes an AND gate G1. The AND gate G1 receives the above-mentioned control signal SP and the inverted signal of the test signal ST, and outputs a result of an AND operation as the precharge signal PL. The control signal SP is directly outputted as the precharge signal PG.

In addition, the power supply voltage VARY and the ground potential VSS are voltages of high and low levels supplied to the sense amplifiers SA. Thus, the global bit lines GBL and the local bit lines LBL operate with the power supply voltage VARY and the ground potential VSS in an active operation of a normal operation. On the other hand, in the test operation, a voltage difference larger than a difference in absolute value between the power supply voltage VARY and the ground potential VSS is supplied to the global bit lines GBL and the local bit lines LBL. Thus, the potential VL may be set to the ground potential VSS even in the test operation.

Figure 6:
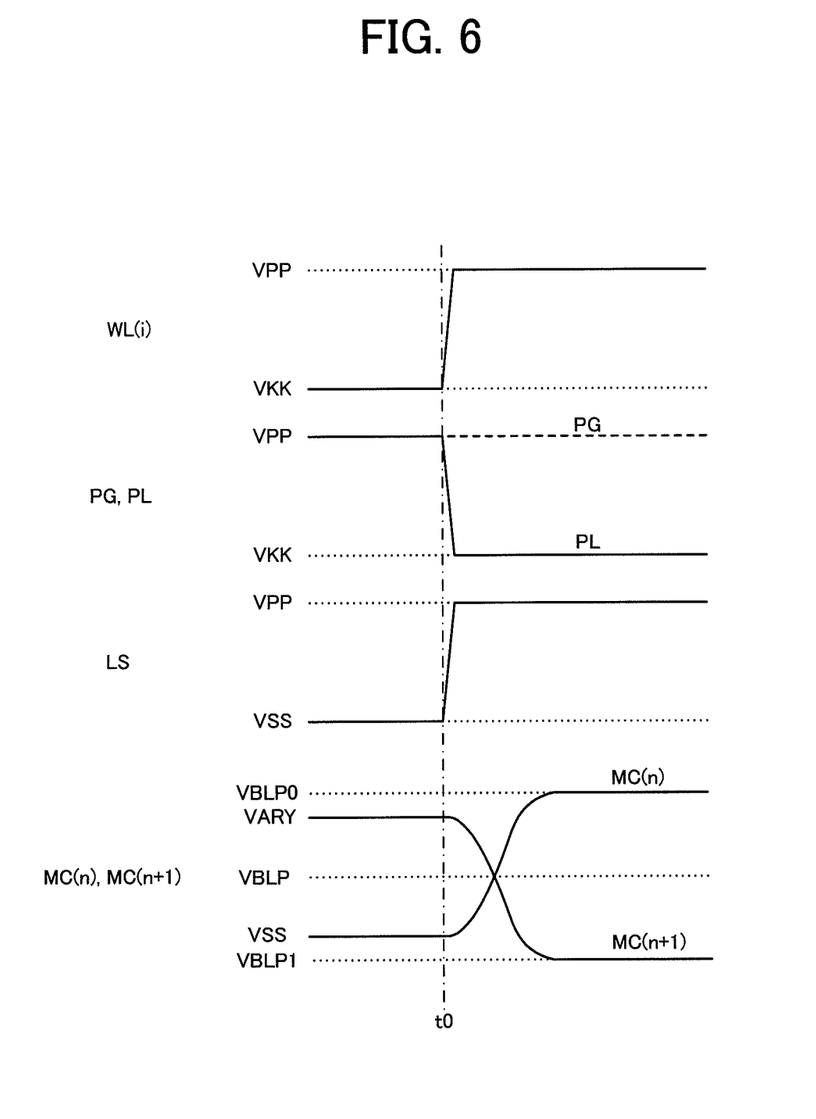
FIG. 6 is a diagram showing operation waveforms when performing a voltage stress test in which a voltage stress is applied to memory cells through local bit lines in the DRAM of the embodiments.

Next, control method and operation waveforms of the DRAM of the embodiments will be described with reference to FIG. 6. FIG. 6 shows operation waveforms when performing a voltage stress test in which a voltage stress is applied to the memory cells MC through the local bit lines LBL in the DRAM having the configurations of FIGS. 2 to 5. The operation waveforms of FIG. 6 include a potential of a word line WL(i) to be selected in FIG. 4, the precharge signals PG and PL, the control signal LS, potentials of two memory cells MC(n) and MC(n+1) corresponding to two local bit lines LBL(n) and LBL(n+1).

The normal operation is shown in an early period before a timing t0 in FIG. 6, and a standby state of the test operation is shown in a later period after the timing t0 in FIG. 6.

In the early period of FIG. 6, the word line WL(i) in a non-selected state is maintained at a low level (voltage VKK as a negative potential). At this point, since the precharge signal PG is maintained at a high level (voltage VPP), both the global bit lines GBL(n) and GBL(n+1) have been precharged through the transistors Q10 and Q11. That is, one global bit line GBL(n) has been precharged to the precharge voltage VBLP0, and the other global bit line GBL (n+1) has been precharged to the precharge voltage VBLP1.

Further, in the early period of FIG. 6, since the control signal LS is maintained at a low level (ground potential VSS), each global bit line GBL has been electrically disconnected from each local bit line LBL by the transistor Q30 in a corresponding sub-array SARY. Meanwhile, since the precharge signal PL is maintained at a high level (voltage VPP), each local bit line LBL has been precharged to the precharge voltage VBLPL through the transistor Q20 at this point. Further, in the early period of FIG. 6, one memory cell MC (n) stores data of a low level (ground potential VSS), and the other memory cell MC (n+1) stores data of a high level (power supply voltage VARY).

Subsequently, at the predetermined timing t0 for starting the test operation, a selected word line WL(i) is driven to a high level (voltage VPP). Thereby, the memory cells MC (n) and MC(n+1) are electrically connected to the corresponding local bit lines LBL(n) and LBL(n+1), respectively. Also, at the timing t0, the precharge signal PL is set to a low level (voltage VKK) and the control signal LS is set to a high level (voltage VPP). Here, the precharge signal PG is maintained at a high level. Thereby, the precharged state of the local bit lines LBL(n) and LBL(n+1) is cancelled, and the global bit line GBL and the corresponding local bit line LBL are connected to each other through the transistor Q30 as the hierarchical switch. In addition, an arbitrary number of word lines WL can be selected, and all the word lines WL may be selected.

As a result of the control at the timing t0, the precharge voltage VBLP0 (the potential VH higher than the power supply voltage VARY) applied to one global bit line GBL(n) is transmitted to the memory cell MC (n) through the transistor Q30 and the local bit line LBL(n). Thereby, the potential of the memory cell MC (n) rises from the ground potential VSS in the early period to the precharge voltage VBLP0. The potential of the local bit line LBL(n) rises from the precharge voltage VBLPL to the precharge voltage VBLP0. The precharge voltage VBLP1 (the potential VL lower than the ground potential VSS) applied to the other global bit line GBL(n+1) is transmitted to the memory cell MC (n+1) through the transistor Q30 and the local bit line LBL(n+1). Thereby, the potential of the memory cell MC (n+1) drops from the power supply voltage VARY in the early period to the precharge voltage VBLP1. The potential of the local bit line LBL(n+1) drops from the precharge voltage VBLPL to the precharge voltage VBLP1. As a result, high and low levels having a voltage difference larger than that in the normal operation (including the active operation and the standby state) are applied to a pair of adjacent global bit lines GBL(n) and GBL(n+1), a pair of adjacent local bit lines LBL(n) and LBL(n+1), and corresponding memory cells MC (n) and MC(n+1). Accordingly, it is possible to achieve a state where voltage stresses are applied to the pair of adjacent global bit lines GBL (n) and GBL (n+1), the pair of adjacent local bit lines LBL(n) and LBL(n+1), and the corresponding memory cells MC, thereby screening an initial failure of the device.

As described above, by employing the configuration and control of the embodiments, it is possible to obtain an effect of suppressing an increase in area when performing the voltage stress test of the global bit lines GBL, the local bit lines LBL and the memory cells MC. That is, according to the conventional method, when the local bit lines LBL of FIG. 4 are precharged to different voltages by using the respective transistors Q20 in the voltage stress test, it is necessary to provide two transistors Q20 on each local bit line LBL and two lines for supplying the precharge voltage VBLP, respectively, in each sub-array SARY, inevitably resulting in an increase in area. Particularly, a larger area is required when the memory cell array ARY is divided into a plurality of sub-arrays SARY. On the other hand, according to the embodiments, the local bit lines LBL are precharged through the transistors Q30 in the voltage stress test by utilizing the global bit line GBL, the transistors Q10 and Q11 attached thereto, and the lines for the precharge voltages VBLP0 and VBLP1, thereby suppressing the increase in area. In addition, the precharge voltage VBLP1 and the low level of the precharge signal PL may be set to the ground potential VSS.

Figure 7:
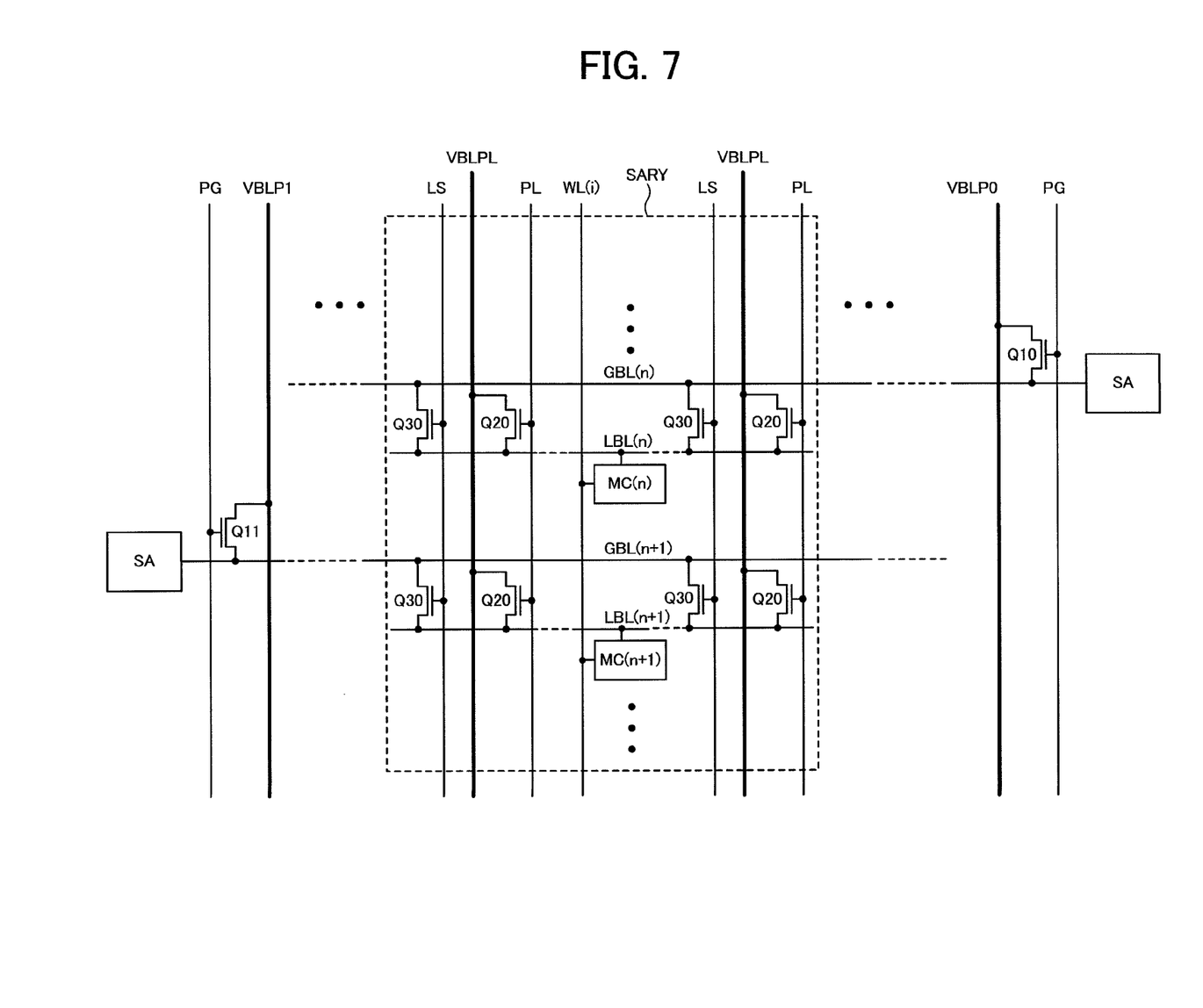
FIG. 7 is a diagram showing a first modification of the embodiments.

The present invention can be applied to various circuit configurations without being limited to the circuit configuration disclosed in the above embodiments. In the following, modifications of the memory cell array ARY shown in FIG. 4 will be described. FIG. 7 shows a first modification of the memory cell array ARY. The first modification is different from the circuit configuration of FIG. 4 in that the transistors Q20 as the third precharge circuits and the transistors Q30 as the hierarchical switches are provided on both sides of each local bit line LBL. Thus, the transistors Q20 and Q30 on either side can be operated in accordance with a selected memory cell MC. Further, two lines for the precharge voltage VBLPL and two lines for the precharge signal PL are provided on both sides of each sub-array SARY. According to the first modification, the number of wiring lines associated with precharging of the local bit lines LBL is twice that of FIG. 4, and by applying the present invention, it is possible to obtain an effect in which the number of wiring lines does not need to be further doubled (quadrupled in total) when performing the voltage stress test.

Figure 8:
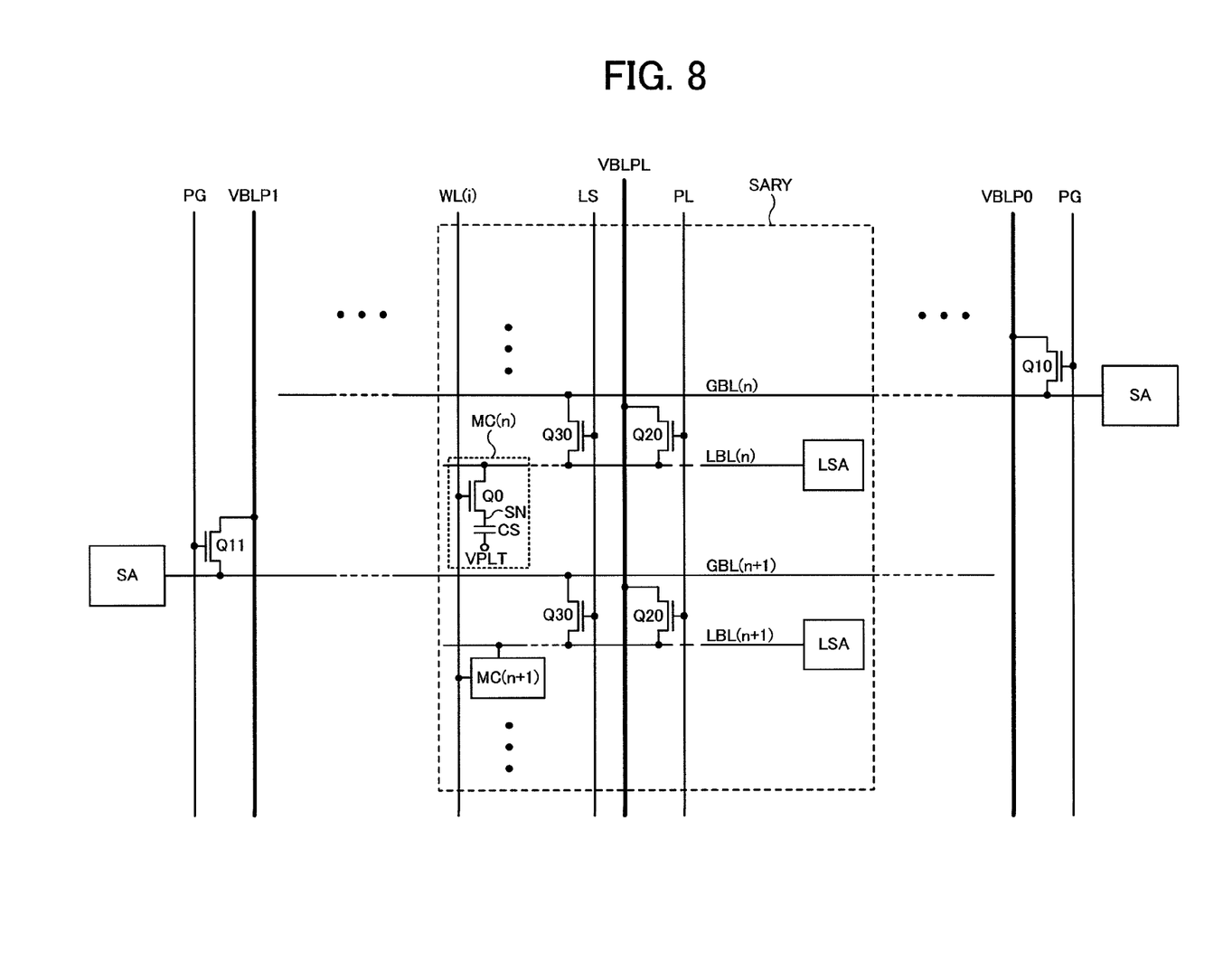
FIG. 8 is a diagram showing a second modification of the embodiments.

FIG. 8 shows a second modification of the memory cell array ARY. The second modification is different from the circuit configuration of FIG. 4 in that a local sense amplifier LSA is provided at one end of each local bit line LBL. In a read operation of the memory cell MC, data is transmitted from the global bit line GBL to the sense amplifier SA without passing through the local sense amplifier LSA, and therefore the operation is performed in the same manner as in FIG. 4. For example, the local sense amplifier LSA can be used in a restoring operation of the memory cell MC. According to the second modification, the above-described effects of the embodiments can be obtained.

In addition, the first modification shown in FIG. 7 may be combined with the second modification shown in FIG. 8. That is, two transistors Q20, two transistors Q30 and two precharge lines may be provided on both sides of each local bit line LBL, and the local sense amplifier LSA may be provided on one end thereof. In this case, the above-described effects of the embodiments can be also obtained.

According to the embodiments, when performing a voltage stress test of memory cells in an array having a hierarchical bit line structure, a stress voltage is applied to local bit lines by utilizing precharge circuits associated with a global bit line. Therefore, even if the number of local bit lines into which the global bit line is segmented increases, it is possible to avoid an increase in the number of precharge lines associated with the local bit lines. Thus, it is possible to improve product reliability by performing the voltage stress test using different potentials without an increase in chip area.

In the foregoing, the preferred embodiments have been described. The present invention disclosed in the embodiments can be widely applied to semiconductor device having a hierarchical bit line structure with volatile or non-volatile memory cells. Further, various circuit configurations can be also employed without being limited to the circuit configurations shown in the embodiments.

The invention can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the invention can be applied to various devices such as SOC (System on Chip), MCP (Multi Chip Package) and POP (Package on Package) and the like.

Further, transistors used for the invention are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor. Note that, in the embodiments, if the first conductive type transistor is replaced with the second conductive type transistor, the potential relation of control signals needs to be reversed in level.

The present invention can be applied to devices based on various combinations or selections of the disclosure of the embodiments. That is, the invention covers various modifications which those skilled in the art can carry out in accordance with all disclosures including claims and technical ideas.

The invention claimed is:

1. A semiconductor device comprising:
an array having a hierarchical bit line structure;
first and second global bit lines physically adjacent to each other;
a plurality of first local bit lines corresponding to the first global bit line and corresponding to a plurality of sub-arrays forming the array;
a plurality of second local bit lines corresponding to the second global bit line and corresponding to the plurality of sub-arrays, the second local bit lines being physically adjacent to the first local bit lines respectively;
a plurality of first hierarchical switches controlling electrical connections between the first global bit line and the first local bit lines respectively;
a plurality of second hierarchical switches controlling electrical connections between the second global bit line and the second local bit lines respectively;
a first precharge circuit precharging the first global bit line to a first precharge voltage;
a second precharge circuit precharging the second global bit line to a second precharge voltage;
a plurality of third precharge circuits precharging the first local bit lines to a third precharge voltage respectively;
a plurality of fourth precharge circuits precharging the second local bit lines to the third precharge voltage respectively; and
a control circuit controlling the first to third precharge circuits and voltage values of the first to third precharge voltages,
wherein, when performing a test of the array,
by achieving a state in which the first and second precharge voltages are set to first and second potential levels different from each other, the first and second precharge circuits are activated, the third and fourth precharge circuits are inactivated, and the first and second hierarchical switches are brought into a connected state,
the control circuit controls the first and second potential level to be applied to the first and second local bit lines through the first and second global bit lines respectively.

2. The semiconductor device according to claim 1, further comprising:
a first line through which the first precharge voltage is supplied to the first precharge circuit;
a second line through which the second precharge voltage is supplied to the second precharge circuit; and
a plurality of third lines through which the third precharge voltage is supplied to the third and fourth precharge circuits respectively, the third lines corresponding to the sub-arrays,
wherein the first and second global bit lines extend in a first direction, and the first, second and third lines extend in a second direction intersecting the first direction.

3. The semiconductor device according to claim 2,
wherein the first and second lines are arranged to sandwich the array,
and each of the third lines is arranged in each of the sub-arrays.

4. The semiconductor device according to claim 3, wherein the plurality of third and fourth precharge circuits include a plurality of third transistors controlling electrical connections between the first local bit lines and the third lines, and a plurality of fourth transistors controlling electrical connections between the second local bit lines and the third lines, respectively, in response to a second precharge signal applied to a gate.

5. The semiconductor device according to claim 4,
wherein the first precharge circuit includes a first transistor controlling an electrical connection between the first global bit line and the first line in response to a first precharge signal applied to its gate,
and the second precharge circuit includes a second transistor controlling an electrical connection between the second global bit line and the second line in response to the first precharge signal applied to its gate.

6. The semiconductor device according to claim 5, wherein the control circuit includes a logic circuit generating the first precharge signal by using a precharge control signal and a test signal that is activated in the test.

7. The semiconductor device according to claim 1,
wherein the control circuit includes first and second switches,
the first switch selectively supplies either one of the first and third precharge voltages to the first precharge circuit, and the second switch selectively supplies either one of the second and third precharge voltages to the second precharge circuit.

8. The semiconductor device according to claim 7, wherein the first and second switches select the first and second precharge voltages respectively in response to the test signal.

9. The semiconductor device according to claim 1, wherein a voltage difference between the first and second potential levels is larger than a voltage difference applied between the first and second local bit lines in a normal operation.

10. The semiconductor device according to claim 9, wherein each of the sub-arrays includes a plurality of memory cells arranged at intersections of the first and second local bit lines and a plurality of word lines.

11. The semiconductor device according to claim 10, wherein the first or second potential level is written into memory cells belonging to at least selected one of the word lines in the test.

12. The semiconductor device according to claim 1, further comprising first and second amplifiers amplifying signal voltages of the first and second global bit lines respectively, the first and second amplifiers being arranged opposite to each other to sandwich the array.

13. A control method of a semiconductor device, the method comprising:

applying first and second potentials different from each other to first and second lines respectively when performing a test operation, the first and second lines functioning to supply a precharge voltage to first and second global bit lines in a normal operation;

applying the first and second potentials to the first and second global bit lines through the first and second lines, the first and second potentials having a voltage difference larger than that being applied between the first and second global bit lines in the normal operation;

applying the first and second potentials to corresponding first and second local bit lines through the first and second global bit lines by activating the first and second hierarchical switches; and stopping supplying the precharge voltage directly to the first and second local bit lines in the normal operation.

14. The control method according to claim 13, further comprising driving a selected word line among a plurality of word lines intersecting the first and second local bit lines and writing the first and second potentials into memory cells belonging to the selected word line.

15. The control method according to claim 13, further comprising driving a selected word line among a plurality of word lines intersecting the first and second local bit lines and writing the first and second potentials into memory cells belonging to the selected word line, in the test operation.

* * * * *